United States Patent
Zheng et al.

(10) Patent No.: US 12,021,487 B2
(45) Date of Patent: Jun. 25, 2024

(54) PHOTOVOLTAIC INVERTER

(71) Applicant: SUNGROW POWER SUPPLY CO., LTD., Anhui (CN)

(72) Inventors: Hao Zheng, Anhui (CN); Qiyao Zhu, Anhui (CN); Jun Tan, Anhui (CN); Yu Gao, Anhui (CN)

(73) Assignee: SUNGROW POWER SUPPLY CO., LTD., Anhui (CN)

( * ) Notice: Subject to any disclaimer, the term of this patent is extended or adjusted under 35 U.S.C. 154(b) by 426 days.

(21) Appl. No.: 17/345,124

(22) Filed: Jun. 11, 2021

(65) Prior Publication Data
US 2021/0391824 A1   Dec. 16, 2021

(30) Foreign Application Priority Data
Jun. 15, 2020   (CN) .......................... 202010542024.5

(51) Int. Cl.
*H02S 40/42*     (2014.01)
*H02S 40/32*     (2014.01)
*H05K 7/20*      (2006.01)

(52) U.S. Cl.
CPC .............. *H02S 40/42* (2014.12); *H02S 40/32* (2014.12); *H05K 7/20909* (2013.01)

(58) Field of Classification Search
CPC ...... H02S 40/32; H02S 40/42; H05K 7/20909
(Continued)

(56) References Cited

U.S. PATENT DOCUMENTS

2007/0279863 A1 * 12/2007 Illerhaus ................... H02J 7/35
                                                        361/695
2014/0247539 A1 *  9/2014 Valencic .................. H02B 1/30
                                                        361/622
(Continued)

FOREIGN PATENT DOCUMENTS

CN         102496960 A    6/2012
CN         102969875 A    3/2013
(Continued)

OTHER PUBLICATIONS

Examination Report dated Feb. 25, 2022, in corresponding Indian Application No. 202114025486.
(Continued)

*Primary Examiner* — Yemane Mehari
(74) *Attorney, Agent, or Firm* — Harness, Dickey & Pierce, P.L.C.

(57) ABSTRACT

A photovoltaic inverter is provided. The photovoltaic inverter includes a cabinet and a power module arranged in the cabinet. The power module includes an inverter power unit, a first ventilating passage and a second ventilating passage isolated from the first ventilating passage. The inverter power unit is arranged upstream of the first ventilating passage in a direction in which air is inputted. The first ventilating passage is provided with a first air inlet and a first air outlet. The second ventilating passage is provided with a second air inlet and a second air outlet. In the photovoltaic inverter according to the present disclosure, the inverter power unit that heats up severely is provided with an independent ventilating passage for heat dissipation. In addition, the inverter power unit is arranged the upstream of the first ventilating passage in the direction in which air flows.

16 Claims, 8 Drawing Sheets

(58) Field of Classification Search
USPC .......................................................... 363/13
See application file for complete search history.

(56) References Cited

U.S. PATENT DOCUMENTS

| | | | | |
|---|---|---|---|---|
| 2018/0352685 | A1* | 12/2018 | Wan | H05K 7/20909 |
| 2020/0076363 | A1* | 3/2020 | Yan | H02M 7/003 |
| 2020/0187391 | A1* | 6/2020 | Zhu | H05K 7/20909 |

FOREIGN PATENT DOCUMENTS

| | | |
|---|---|---|
| CN | 202772807 U | 3/2013 |
| CN | 204190632 U | 3/2015 |
| CN | 206807310 U | 12/2017 |

OTHER PUBLICATIONS

Extended European Search Report regarding Application No. 21177538.2, dated Nov. 15, 2021.

* cited by examiner

PHOTOVOLTAIC INVERTER

The present disclosure claims the priority to Chinese patent application No. 202010542024.5 titled "PHOTOVOLTAIC INVERTER", filed with the China National Intellectual Property Administration on Jun. 15, 2020, which is incorporated herein by reference in its entirety.

FIELD

The present disclosure relates to the technical field of electrical devices, and in particular to a photovoltaic inverter.

BACKGROUND

As an interface device between a solar power generation system and a power grid, a photovoltaic inverter is required to meet circuit design and implementation. Further, good heat dissipation performance of a power module in the photovoltaic inverter is required to be ensured. The heat dissipation performance of a heating component in the photovoltaic inverter has an important impact on stability and reliability of the photovoltaic inverter, and a service life of a power module.

The photovoltaic inverter according to the conventional technology has a complex layout. In order to ensure a protection level of the photovoltaic inverter, advantages of a ventilating passage in the photovoltaic inverter are sacrificed. That is, air flows from a lower side of the photovoltaic inverter to an upper side of the photovoltaic inverter. In this case, a module sensitive to heat (for example, an inverter power unit) is near an air outlet, and a module having high temperature resistant (for example, a reactance unit) is near an air inlet, resulting in low heat dissipation efficiency of the inverter power unit.

Therefore, how to improve the heat dissipation efficiency of the inverter power unit is an urgent technical problem to be solved by those skilled in the art.

SUMMARY

A photovoltaic inverter is provided according to the present disclosure, to improve heat dissipation efficiency of an inverter power unit.

A photovoltaic inverter is provided according the present disclosure. The photovoltaic inverter includes a cabinet and a power module arranged in the cabinet. The power module includes an inverter power unit, a first ventilating passage and a second ventilating passage that is isolated from the first ventilating passage. The inverter power unit is arranged upstream of the first ventilating passage in a direction in which air is inputted. The first ventilating passage is provided with a first air inlet and a first air outlet. The second ventilating passage is provided with a second air inlet and a second air outlet.

In an embodiment, the photovoltaic inverter further includes a reactance unit arranged in the first ventilating passage. Only the reactance unit and the inverter power unit are arranged in the first ventilating passage. The reactance unit is arranged downstream of the inverter power unit in a direction in which air flows.

In an embodiment, a capacitor cell, an alternating current power distribution unit and a direct current power distribution unit are arranged in second ventilating passage.

In an embodiment, the second ventilating passage includes a capacitor cell side passage and a direct current side passage. The capacitor cell is arranged upstream of the capacitor cell side passage. The alternating current power distribution unit is arranged downstream of the capacitor cell side passage. The direct current power distribution unit is arranged in the direct current side passage.

In an embodiment, an air intake passage of the cabinet is arranged on top of the cabinet. The first air inlet and the second air inlet are arranged on top of the power module and are communicated with the air intake passage. The first air outlet of the first ventilating passage and the second air outlet of the second ventilating passage are arranged at a bottom of the cabinet.

In an embodiment, the air intake passage is a lateral air intake passage. A side-wall of the air intake passage is circumferentially arranged on top of the cabinet. A strip-shaped louver air inlet is arranged on the side-wall of the air intake passage.

In an embodiment, a first fan is arranged in the first air inlet, a second fan s arranged in the second air inlet, and a wind pressure of the first fan is greater than a wind pressure of the second fan. The second ventilating passage is separated from the first ventilating passage by a baffle. A portion of the lateral air intake passage adjacent to the first air inlet and a portion of the lateral air intake passage adjacent to the second air inlet are located on two adjacent lateral surfaces. The second air inlet is adjacent to the first air inlet.

In an embodiment, an air inlet of the capacitor cell side passage is arranged diagonally from an air inlet of the direct current side passage. An air inlet on a side-wall of a ventilating passage connected to the capacitor cell side passage and the direct current side passage is communicated with the first air inlet.

In an embodiment, the number of the power module is at least two.

In an embodiment, two adjacent power modules are mirror-symmetrically arranged in the cabinet or arranged in sequence in the cabinet.

In an embodiment, the number of the power modules is two. For each of the two power modules, the first ventilating passage and the capacitor cell side passage of the power module are arranged inside the power module. The direct current side passages of the two power modules are arranged on two opposite sides of the photovoltaic inverter.

In an embodiment, side-walls of the first ventilating passages of the two adjacent power modules are arranged to be adjacent to each other. A water-blocking ring is arranged on circumference of the first air inlet. The water-blocking ring is lower than the baffle in height.

In an embodiment, a water-blocking groove is arranged in the air intake passage 4. The water-blocking groove faces towards the first air inlet and the second air inlet. The water-blocking groove is arranged on an inner surface of the side-wall of the air intake passage.

In an embodiment, the reactance unit and the alternating current power distribution unit are arranged in middle of a lower part of the cabinet. The alternating current power distribution unit includes an alternating current air circuit breaker and an alternating current output wiring copper bar which is connected to the alternating current air circuit breaker.

In an embodiment, the alternating current power distribution unit further includes an alternating current fuse.

In an embodiment, the alternating current fuse is arranged above the alternating current output wiring copper bar. The alternating current fuse and the alternating current output wiring copper bar are both arranged at a lateral portion of the alternating current air circuit breaker.

In an embodiment, the direct current side passages of the two power modules are respectively arranged on left and right sides of the cabinet. Each of the direct current side passages is provided with a direct current power distribution unit. The inverter power units are arranged between the direct current power distribution units.

In an embodiment, the capacitor cell is arranged directly above the alternating current power distribution unit. The inverter power unit is arranged directly above the reactance unit. In the same power module, the inverter power units, the reactance unit, the capacitor cell, and the alternating current power distribution unit are all arranged on a same side of the direct current power distribution units.

In the above technology solutions, the photovoltaic inverter according to the present disclosure includes a cabinet and a power module arranged in the cabinet. The power module includes an inverter power unit, a first ventilating passage and a second ventilating passage. The second ventilating passage is isolated from the first ventilating passage. The inverter power unit is arranged upstream of the first ventilating passage in a direction in which air is inputted. The first ventilating passage is provided with a first air inlet and a first air outlet. The second ventilating passage is provided with a second air inlet and a second air outlet.

It can be seen from the above description that in the photovoltaic inverter according to the present disclosure, the inverter power unit that heats up severely is provided with an independent ventilating passage for heat dissipation. In addition, the inverter power unit is arranged the upstream of the first ventilating passage in the direction in which air flows, so that the inverter power unit can be timely cooled by cold air, thereby improving the heat dissipation efficiency of the inverter power unit.

BRIEF DESCRIPTION OF THE DRAWINGS

In order to illustrate technical solutions in embodiments of the present disclosure or the conventional technology more clearly, hereinafter drawings to be used in the description of the embodiments or the conventional technology are described simply. Apparently, the drawings described below are only for the embodiments of present disclosure. For those skilled in the art, other drawings may be obtained based on the provided drawings without any creative work.

In FIGS. 1 to 10:

Figure 1:
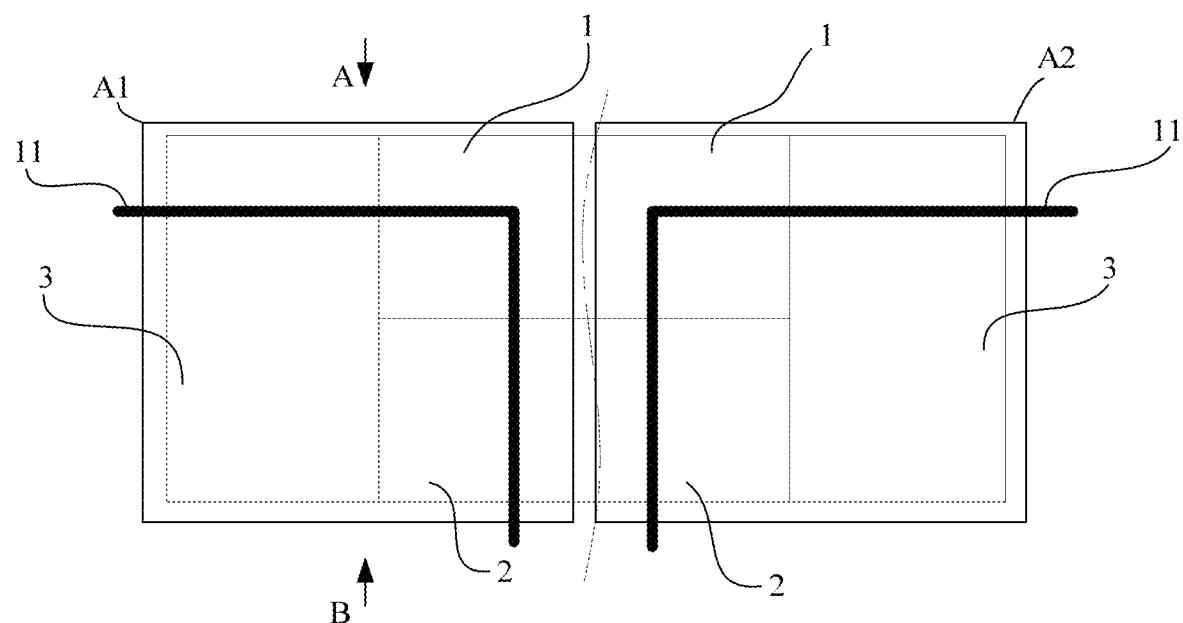
FIG. 1 is a top view of a photovoltaic inverter according to an embodiment of the present disclosure.
Figure 2:
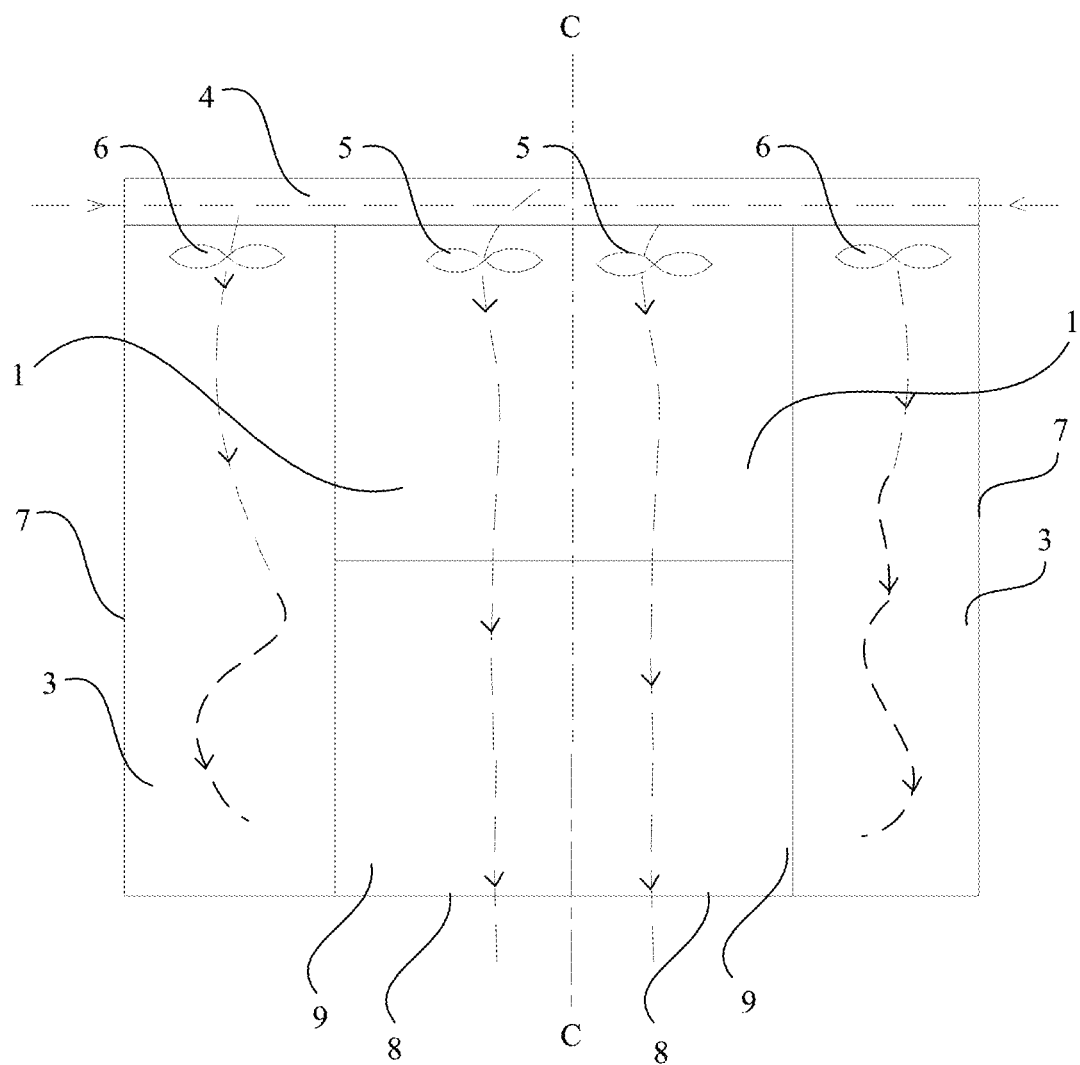
FIG. 2 is a side view of a power model on a left side of FIG. 1 from a direction indicated by A.
Figure 3:
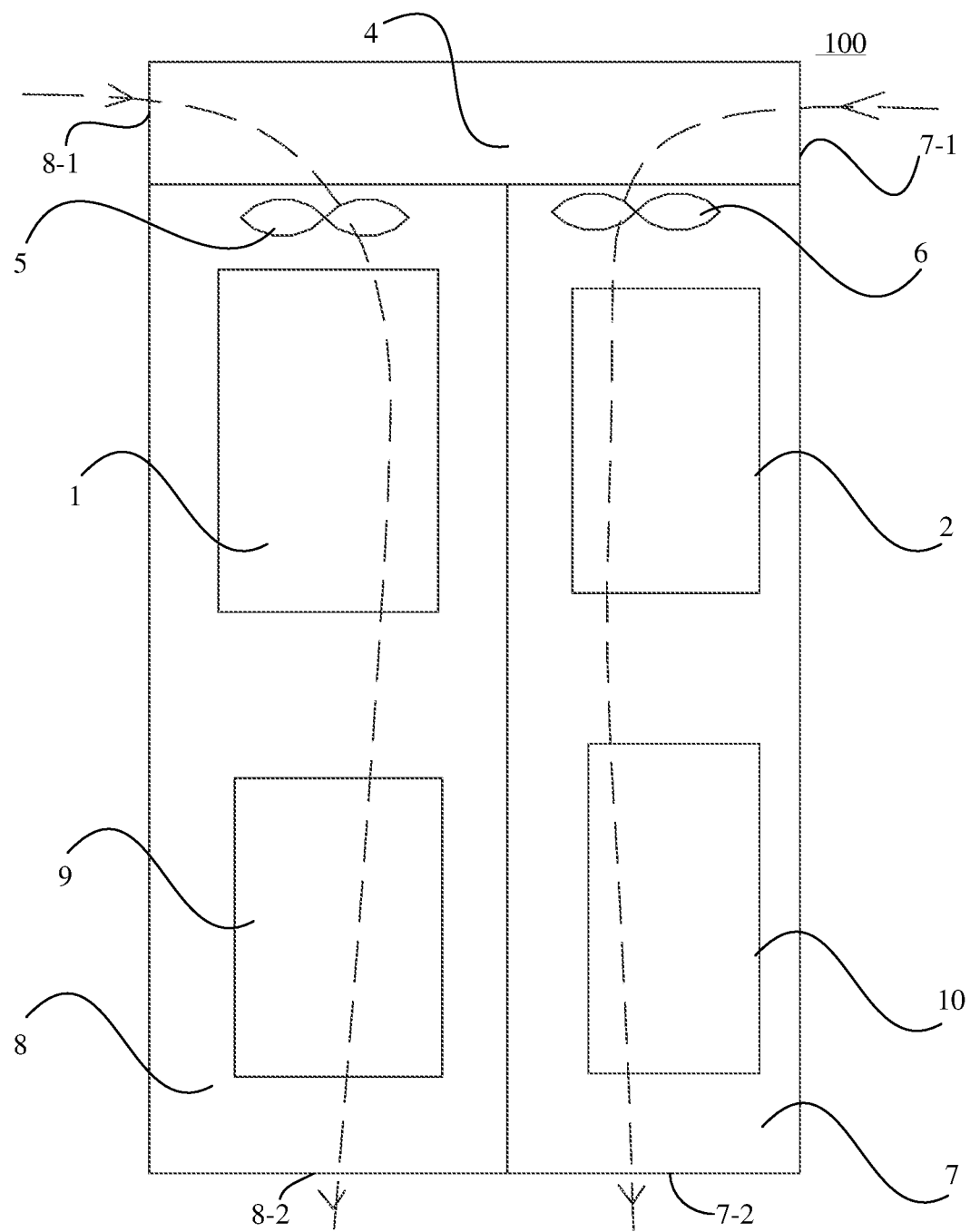
FIG. 3 is a schematic structural diagram of the power model in FIG. 2 along a direction indicated by C-C.
Figure 4:
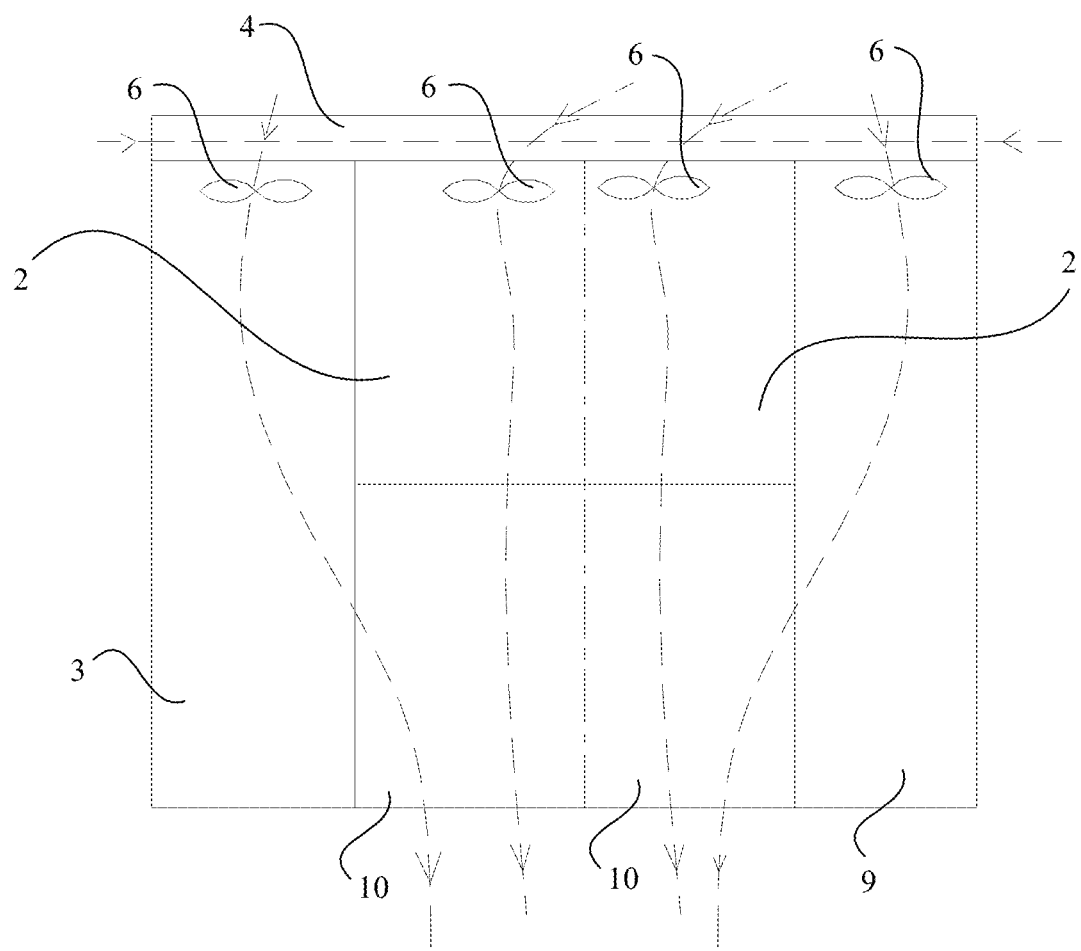
FIG. 4 is a side view of the power model on the left side of FIG. 1 from a direction indicated by B.

| | |
|---|---|
| 1 | inverter power unit; |
| 2 | capacitor cell; |
| 3 | direct current power distribution unit; |
| 4 | air intake passage; |
| 5 | first fan; |
| 6 | second fan; |
| 7 | second ventilating passage; |
| 8 | first ventilating passage; |
| 9 | reactance unit; |
| 10 | alternating current power distribution unit; |
| 10-1 | alternating current fuse; |
| 10-2 | alternating current air circuit breaker; |
| 10-3 | alternating current output wiring copper bar; |
| 11 | copper bar; |
| 12 | baffle; |
| 13 | water-blocking ring; |
| 14 | louver air inlet; |
| 15 | water-blocking groove; |
| A1 | first power module; |
| A2 | second power module. |

DETAILED DESCRIPTION

A photovoltaic inverter is provided according to the present disclosure, to improve heat dissipation efficiency of an inverter power unit.

In order to make those skilled in the art understand the technical solutions of the present disclosure clearer, the present disclosure is further described in detail in conjunction with the drawings and embodiments.

Reference is made to FIGS. 1 to 7.

A photovoltaic inverter according to an embodiment of the present disclosure includes a cabinet 100 and a power module arranged in the cabinet. The power module includes an inverter power unit 1, a first ventilating passage 8 and a second ventilating passage 7. The second ventilating passage 7 is isolated from the first ventilating passage 8. The inverter power unit 1 is arranged upstream of the first ventilating passage 8 in a direction in which air is inputted. The first ventilating passage 8 is provided with a first air inlet 8-1 and a first air outlet 8-2. The second ventilating passage 7 is provided with a second air inlet 7-1 and a second air outlet 7-2. Heating components in the cabinet may be connected to each other via a copper bar 11.

It can be seen from the above description that, in the photovoltaic inverter according to the embodiment of the present disclosure, the inverter power unit 1 that heats up severely is provided with an independent ventilating passage for heat dissipation. In addition, the inverter power unit 1 is arranged upstream of the first ventilating passage 8 in the direction in which air flows, so that the inverter power unit 1 can be timely cooled by cold air, thereby improving the heat dissipation efficiency of the inverter power unit 1.

In an embodiment, the photovoltaic inverter further includes a reactance unit 9 arranged in the first ventilating passage 8. Only the reactance unit 9 and the inverter power unit 1 are arranged in the first ventilating passage 8. The reactance unit 9 is arranged downstream of the inverter power unit 1 in a direction in which air flows. Specifically, the reactance unit 9 may be arranged directly below the inverter power unit 1. The reactance unit 9 being arranged downstream of the inverter power unit 1 may not affect the reactance unit 9 severely due to high temperature resistance of the reactance unit 9. Therefore, the heat dissipation efficiency of the photovoltaic inverter can be improved, and a failure rate of the photovoltaic inverter can be reduced, thereby saving spaces, reducing manufacturing cost and customer use cost.

A capacitor cell 2, an alternating current power distribution unit 10 and a direct current power distribution unit 3 are arranged in the second ventilating passage 7. The alternating current power distribution unit 10 includes an alternating current fuse and an alternating current switch. The direct current power distribution unit 3 includes a direct current switch and a direct current fuse. The capacitor cell 2 is a direct current capacitor cell.

The reactance unit 9 and the alternating current power distribution unit 10 are arranged in middle of a lower part of the cabinet.

The alternating current power distribution unit 10 includes an alternating current air circuit breaker (ACB) 10-2 and an alternating current output wiring copper bar 10-3 which is connected to the alternating current circuit breaker 10-2. That is, the alternating current switch is the alternating current ACB 10-2, which has an electric operation function and is unnecessarily used with an alternating current contactor, so as to save component cost.

The alternating current power distribution unit 10 further includes an alternating current fuse 10-1 electrically connected between the alternating current air circuit breaker 10-2 and the alternating current output wiring copper bar 10-3. The alternating current fuse 10-1 serves as an optional component and is configured to protect the entire photovoltaic inverter. The alternating current fuse 10-1 may be arranged above the alternating current output wiring copper bar 10-3. In an embodiment, the alternating current fuse 10-1 is arranged directly above the alternating current output wiring copper bar 10-3. Both the alternating current fuse 10-1 and the alternating current output wiring copper bar 10-3 are arranged on a side of the alternating current air circuit breaker 10-2, so that the photovoltaic inverter can have a compact structure, and a length of the copper bar 11 between adjacent modules can be reduced.

The alternating current air circuit breaker 10-2 is arranged between the alternating current fuse 10-1 and the direct current power distribution unit 3.

In an embodiment, the second ventilating passage 7 includes a capacitor cell side passage and a direct current side passage. The capacitor cell 2 is arranged upstream of the capacitor cell side passage. The alternating current power distribution unit 10 is arranged downstream of the capacitor cell side passage. The direct current power distribution unit 3 is arranged in the direct current side passage.

In an embodiment, an air intake passage 4 of the cabinet is arranged on top of the cabinet. The first air inlet of the first ventilating passage 8 and the second air inlet of the second ventilating passage 7 are arranged on top of the power module. The first air inlet of the first ventilating passage 8 and the second air inlet of the second ventilating passage 7 are communicated with the air intake passage 4. The first air outlet of the first ventilating passage 8 and the second air outlet of the second ventilating passage 7 are arranged at a bottom of the cabinet. In this way, the air flows from the top of the cabinet to the bottom of the cabinet, thereby further improving the heat dissipation efficiency of the photovoltaic inverter. Alternatively, the air may flow from the bottom of the cabinet to the top of the cabinet, or from a side of the cabinet to a side of the cabinet.

The air intake passage 4 is a lateral air intake passage to facilitate an entry of the air. A side-wall of the air intake passage 4 is circumferentially arranged on top of the cabinet. The side-wall of the air intake passage 4 is provided with a strip-shaped louver air inlet 14. The air inlet of the air intake passage 4 is provided with dust-proof cotton to avoid an entry of impurities. The dust-proof cotton may be arranged in the air inlet 14.

In order to improve the heat dissipation efficiency, a first fan 5 is arranged in the first air inlet of the first ventilating passage 8, a second fan 6 is arranged in the second air inlet of the second ventilating passage 7, and a wind pressure of the first fan 5 is greater than a wind pressure of the second fan 6. The second ventilating passage 7 is separated from the first ventilating passage 8 by a baffle 12. A portion of the lateral air intake passage adjacent to the first air inlet of the first ventilating passage 8 and a portion of the lateral air intake passage adjacent to the second air inlet of the second ventilating passage 7 are located on two adjacent lateral surfaces, where the second air inlet is adjacent to the first air inlet. Since the first ventilating passage 8 and the second ventilating passage 7 have different requirements for air volume and the power module is sensitive to heat, air volume in the first ventilating passage 8 is relatively large, to avoid damage to the power module due to high temperature.

The baffle 12 is a U-shaped baffle that is arranged for a second air inlet of the second fan 6 and opens towards the lateral air intake passage. The baffle 12 is arranged for the second air inlet of the second fan 6, to prevent the first fan 5 from scrambling for air with the second fan 6. The second air inlet has a slope surface and gradually thickens toward an outer surface of the air intake passage 4, to prevent rainwater from entering the second air inlet of the second fan 6.

In an embodiment, no baffle is arranged for a first air inlet of the first fan 5, to meet requirements of large air volume of the first fan 5.

Each of the first fan 5 and the second fan 6 may be a centrifugal fan.

Since the first fan 5 and the second fan 6 have different wind pressures, and the portion of the lateral air intake passage adjacent to the first air inlet of the first ventilating passage 8 and the portion of the lateral air intake passage adjacent to the second air inlet of the second ventilating passage 7 are located on two adjacent lateral surfaces. Specifically, an air inlet of the capacitor cell side passage is arranged diagonally from an air inlet of the direct current side passage. Further, an air inlet on a side-wall of a ventilating passage connected to the capacitor cell side passage and the direct current side passage is communicated with the first air inlet of the first ventilating passage 8. Multiple side-walls of the ventilating passage are communicated with the first air inlet of the first ventilating passage 8, so that air inlet requirement of the first ventilating passage 8 can be ensured, thereby realizing effective heat dissipation.

As shown in FIG. 1, in an embodiment, the number of the power module is at least two. Two adjacent power modules may be mirror-symmetrically arranged in the cabinet or arranged in sequence in the cabinet.

Specifically, the number of the power modules is two. For each of the two power modules, the first ventilating passages 8 and the capacitor cell side passages of the power module are arranged inside the power module. The direct current side passages of the two power modules are arranged on two opposite sides of the photovoltaic inverter. The two direct current side passages are respectively arranged on left and right sides of the cabinet in a longitudinal direction of the cabinet. The first ventilating passage and the capacitor cell side passage are arranged between the direct current side passages. In this way, an overall structure of the photovoltaic inverter is compact. The two first ventilating passages 8 that are adjacent to each other may be intercommunicated or not intercommunicated with each other. The two capacitor cell side passages may be intercommunicated or not intercommunicated with each other.

In an embodiment, side-walls of the first ventilating passages 8 of the two adjacent power modules are arranged to be adjacent to each other. A water-blocking ring 13 is arranged on circumference of the first air inlet. The water-blocking ring 13 is lower than the baffle 12 in height. The water-blocking ring 13 is arranged on the circumference of the first air inlet, to prevent rainwater from entering the first air inlet.

Figure 5:
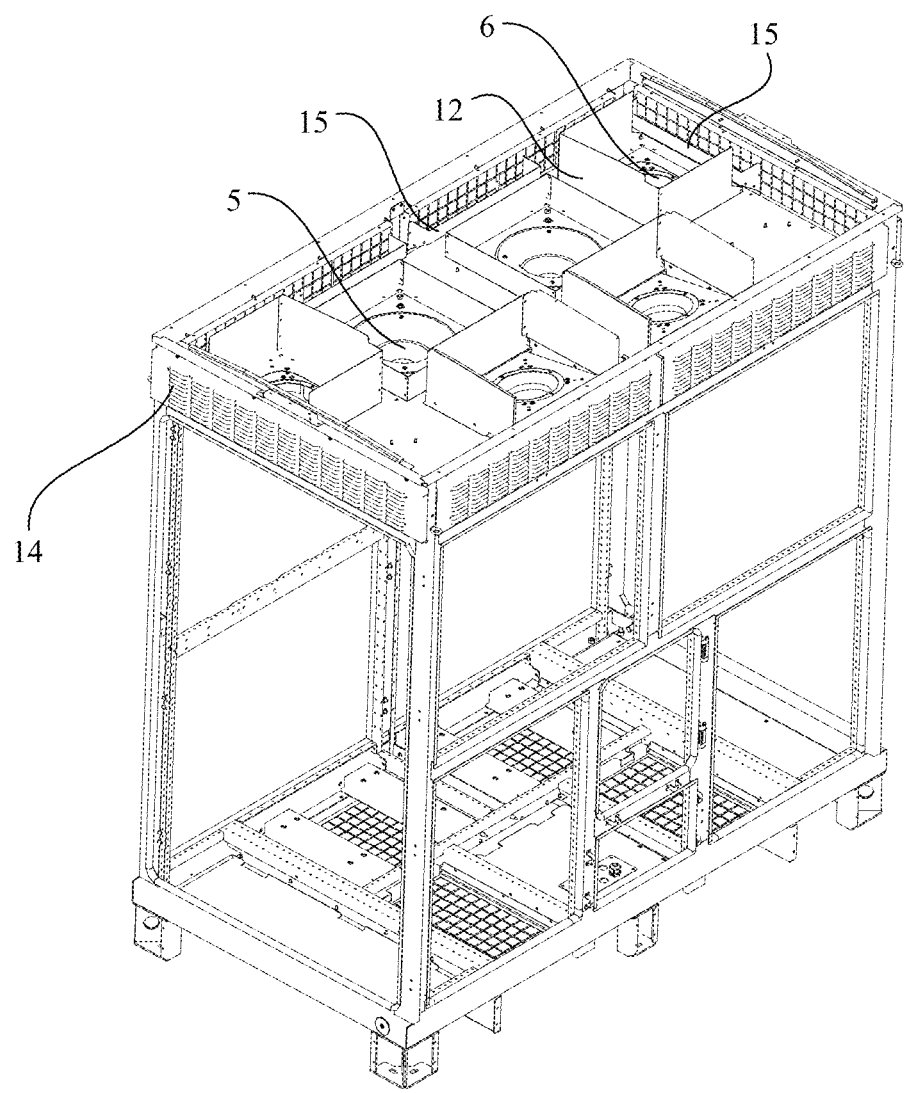
FIG. 5 is a three-dimensional structure diagram showing a framework of a photovoltaic inverter according to an embodiment of the present disclosure.
Figure 6:
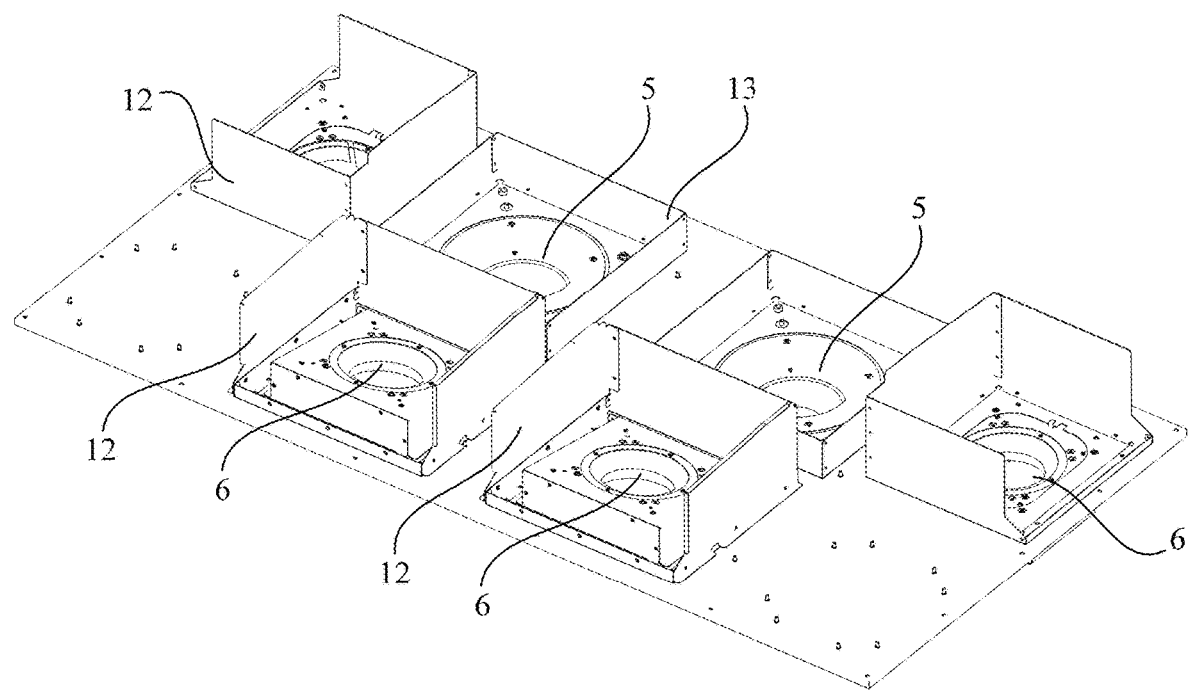
FIG. 6 is a structural diagram showing an arrangement of an air intake passage according to an embodiment of the present disclosure.
Figure 7:
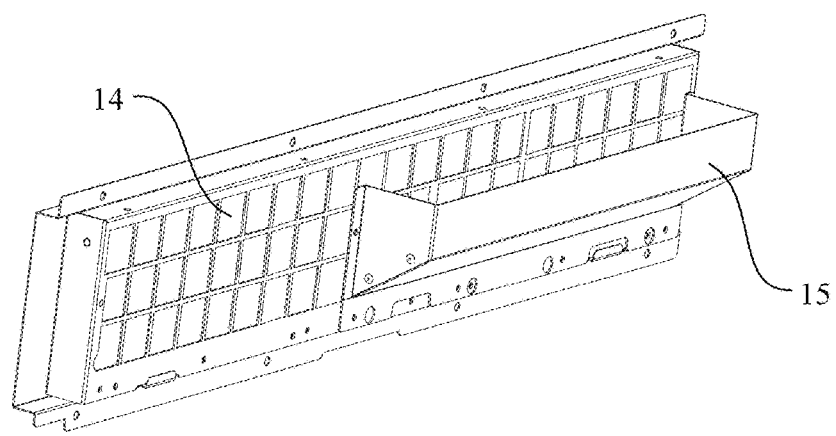
FIG. 7 is a diagram showing an arrangement of a water-blocking groove according to an embodiment of the present disclosure.
Figure 8:
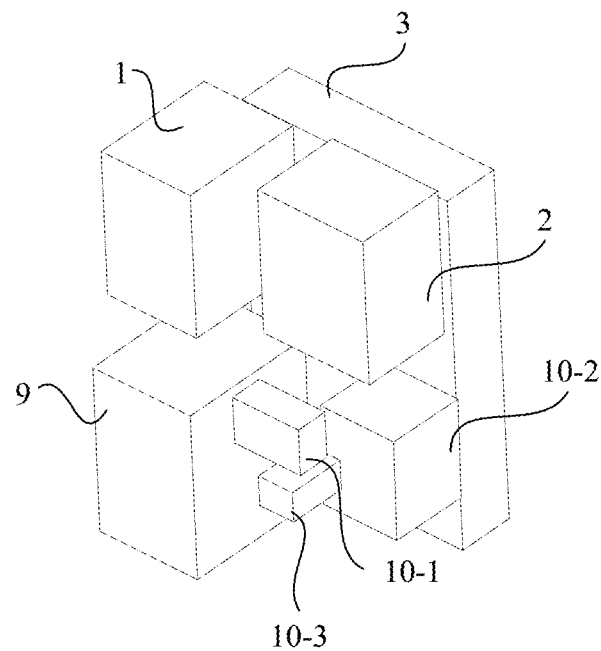
FIG. 8 is a diagram showing an arrangement of units in a power module according to an embodiment of the present disclosure.
Figure 9:
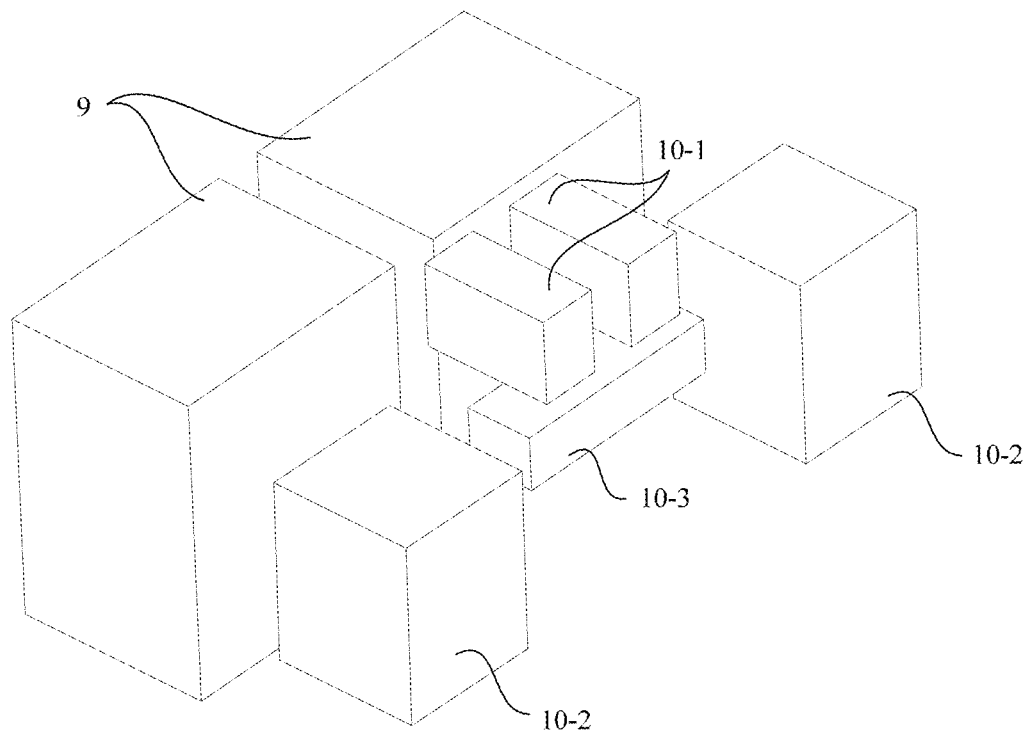
FIG. 9 is a schematic showing an arrangement of units in a lower part of two power modules according to an embodiment of the present disclosure.

As shown in FIGS. 5 to 7, a water-blocking groove 15 is arranged in the air intake passage 4. The water-blocking groove 15 faces towards the first air inlet and the second air inlet. The water-blocking groove 15 is arranged on an inner surface of the side-wall of the air intake passage 4. As shown in FIG. 7, the water-blocking groove 15 has an upper opening, and a bottom of the water-blocking groove 15 is connected to the louver air inlet 14 of the air intake passage 4. Rainwater flowing in the water-blocking groove 15 is discharged from the louver air inlet 14, so as to prevent the rainwater from accumulating in the water-blocking groove 15.

As shown in FIG. 1, the photovoltaic inverter has a mirror-symmetrical layout and is divided into a first power module A1 and a second power module A2. The copper bar 11 is connected as shown in FIG. 1, and has a short wiring path. A copper bar 11 in the first power module A1 and a copper bar 11 in the second power module A2 may be implemented by one copper bar.

In an embodiment of the present disclosure, in the photovoltaic inverter, heating components other than the inverter power unit 1 and the reactance unit 9 are all arranged in the second ventilating passage 7. Cold air entering from a top side of the cabinet is guided by the second fan 6 into the second ventilating passage 7 along a direction in which air flows in the second ventilating passage 7, to cool heating components in the capacitor cell side passage and the direct current side passage, so as to meet heat dissipation in the second ventilating passage 7.

The inverter power unit 1 and the reactance unit 9 are arranged on one side of a middle of the photovoltaic inverter, and the direct current capacitor cell and the alternating current power distribution unit are arranged on the other side of the middle of the photovoltaic inverter. The first ventilating passage and the second ventilating passage are independent of each other. In view of this arrangement of the ventilating passages, heat dissipation efficiency can be improved and the failure rate of the photovoltaic inverter can be reduced based on heat generation characteristics of modules in the photovoltaic inverter.

Figure 10:
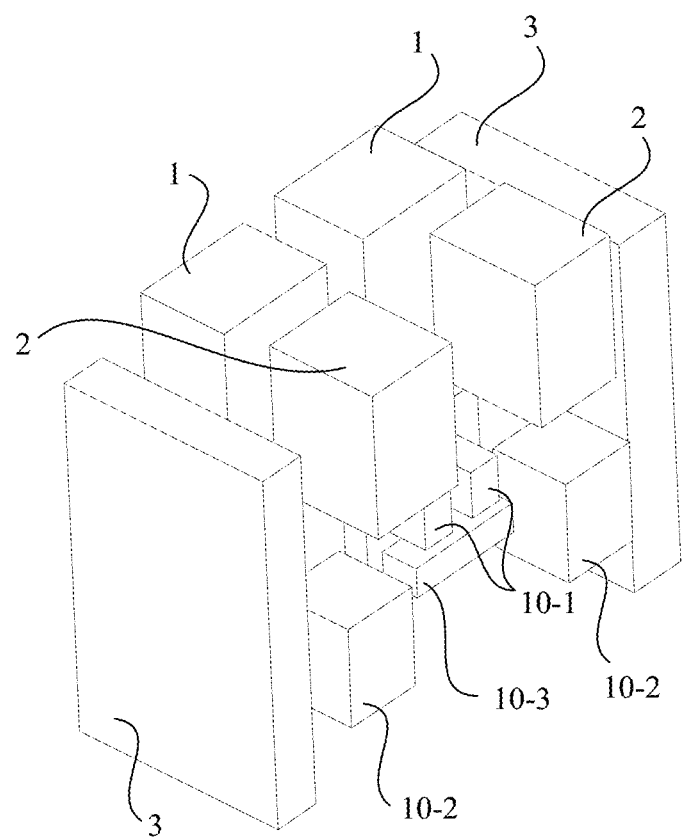
FIG. 10 is a schematic showing an arrangement of units in two power modules according to an embodiment of the present disclosure.

As shown in FIG. 10, the direct current side passages of the two power modules are respectively arranged on left and right sides of the cabinet. Each of the direct current side passages is provided with a direct current power distribution unit 3. The inverter power units 1 are arranged between the two direct current power distribution units 3. The two inverter power units 1 are arranged at a same height.

In an embodiment, the capacitor cell 2 is arranged directly above the alternating current power distribution unit 10. The inverter power unit 1 is arranged directly above the reactance unit 9. In the same power module, the inverter power units 1, the reactance unit 9, the capacitor cell 2, and the alternating current power distribution unit 10 are all arranged on a same side of the direct current power distribution unit 3.

For example, in the same power module, a current flows through the direct current power distribution unit 3, the capacitor cell 2, the inverter power unit 1, the reactance unit 9, the alternating current air circuit breaker 10-2, the alternating current fuse 10-1, and the alternating current output wiring copper bar 10-3 sequentially. Output ends of the two power modules may be connected in parallel or not in parallel. Since the photovoltaic inverter has a compact and space saving layout, and the wiring path of the copper bar 11 in the photovoltaic inverter is short, cost of the copper bar 11 can be reduced. The alternating current output wiring copper bars 10-3 of the two power modules may be connected in parallel or not in parallel, so as to meet customization requirements of a user, that is, to meet requirements of low-cost of the copper bar 11 in the photovoltaic inverter and diverse options of the user.

The embodiments in this specification are described in a progressive way, each of which emphasizes the differences from others, and the same or similar parts among the embodiments can be referred to each other.

Based on the above description of the disclosed embodiments, those skilled in the art can implement or carry out the present disclosure. It is apparent for those skilled in the art to make many modifications to these embodiments. The general principle defined herein may be applied to other embodiments without departing from the spirit or scope of the present disclosure. Therefore, the present disclosure is not limited to the embodiments illustrated herein, but should be defined by the widest scope consistent with the principle and novel features disclosed herein.

The invention claimed is:

1. A photovoltaic inverter comprising:
 a cabinet; and
 a power module arranged in the cabinet, wherein
 the power module comprises an inverter power unit, a first ventilating passage and a second ventilating passage;
 the second ventilating passage is isolated from the first ventilating passage;
 the inverter power unit is arranged upstream of the first ventilating passage in a direction in which air is inputted;
 the first ventilating passage is provided with a first air inlet and a first air outlet; and
 the second ventilating passage is provided with a second air inlet and a second air outlet, wherein the second ventilating passage comprises a capacitor cell side passage and a direct current side passage, a capacitor cell is arranged upstream of the capacitor cell side passage, an alternating current power distribution unit is arranged downstream of the capacitor cell side passage, and a direct current power distribution unit is arranged in the direct current side passage.

2. The photovoltaic inverter according to claim 1, further comprising:
 a reactance unit arranged in the first ventilating passage, wherein
 only the reactance unit and the inverter power unit are arranged in the first ventilating passage; and
 the reactance unit is arranged downstream of the inverter power unit in a direction in which air flows.

3. The photovoltaic inverter according to claim 1, wherein an air intake passage of the cabinet is arranged on top of the cabinet;

the first air inlet and the second air inlet are arranged on top of the power module and are communicated with the air intake passage; and the first air outlet of the first ventilating passage and the second air outlet of the second ventilating passage are arranged at a bottom of the cabinet.

4. The photovoltaic inverter according to claim 3, wherein the air intake passage is a lateral air intake passage;
a side-wall of the air intake passage is circumferentially arranged on top of the cabinet; and
a strip-shaped louver air inlet is arranged on the side-wall of the air intake passage.

5. The photovoltaic inverter according to claim 4, wherein a first fan is arranged in the first air inlet, a second fan is arranged in the second air inlet, and a wind pressure of the first fan is greater than a wind pressure of the second fan;
the second ventilating passage is separated from the first ventilating passage by a baffle; and
a portion of the lateral air intake passage adjacent to the first air inlet and a portion of the lateral air intake passage adjacent to the second air inlet are located on two adjacent lateral surfaces, wherein the second air inlet is adjacent to the first air inlet.

6. The photovoltaic inverter according to claim 5, wherein an air inlet of the capacitor cell side passage is arranged diagonally from an air inlet of the direct current side passage; and
an air inlet on a side-wall of a ventilating passage connected to the capacitor cell side passage and the direct current side passage is communicated with the first air inlet.

7. The photovoltaic inverter according to claim 5, wherein the number of the power module is at least two.

8. The photovoltaic inverter according to claim 7, wherein two adjacent power modules are mirror-symmetrically arranged in the cabinet or arranged in sequence in the cabinet.

9. The photovoltaic inverter according to claim 7, wherein the number of the power modules is two,
for each of the two power modules, the first ventilating passage and the capacitor cell side passage of the power module are arranged inside the power module; and
the direct current side passages of the two power modules are arranged on two opposite sides of the photovoltaic inverter.

10. The photovoltaic inverter according to claim 8, wherein
side-walls of the first ventilating passages of the two adjacent power modules are arranged to be adjacent to each other; and a water-blocking ring is arranged on circumference of the first air inlet, wherein the water-blocking ring is lower than the baffle in height.

11. The photovoltaic inverter according to claim 8, wherein
a water-blocking groove is arranged in the air intake passage, and the water-blocking groove faces towards the first air inlet and the second air inlet; and
the water-blocking groove is arranged on an inner surface of the side-wall of the air intake passage.

12. The photovoltaic inverter according to claim 8, wherein
the reactance unit and the alternating current power distribution unit are arranged in middle of a lower part of the cabinet; and
the alternating current power distribution unit comprises an alternating current air circuit breaker and an alternating current output wiring copper bar, wherein the alternating current output wiring copper bar is connected to the alternating current air circuit breaker.

13. The photovoltaic inverter according to claim 12, wherein the alternating current power distribution unit further comprises an alternating current fuse electrically connected between the alternating current air circuit breaker and the alternating current output wiring copper bar.

14. The photovoltaic inverter according to claim 13, wherein
the alternating current fuse is arranged above the alternating current output wiring copper bar; and
the alternating current fuse and the alternating current output wiring copper bar are both arranged at a lateral portion of the alternating current air circuit breaker.

15. The photovoltaic inverter according to claim 12, wherein
the direct current side passages of the two power modules are respectively arranged on left and right sides of the cabinet;
each of the direct current side passages is provided with the direct current power distribution unit; and
the inverter power units are arranged between the direct current power distribution units.

16. The photovoltaic inverter according to claim 1, wherein
the capacitor cell is arranged directly above the alternating current power distribution unit;
the inverter power unit is arranged directly above the reactance unit;
in the same power module, the inverter power units, the reactance unit, the capacitor cell, and the alternating current power distribution unit are all arranged on a same side of the direct current power distribution unit.

* * * * *